United States Patent
Choy et al.

(10) Patent No.: US 8,729,951 B1
(45) Date of Patent: May 20, 2014

(54) VOLTAGE RAMP-UP PROTECTION

(71) Applicants: Jon S. Choy, Austin, TX (US); Richard Titov Lara Saez, Campinas (BR); Luis Eduardo Rueda Guerrero, Delft (NL)

(72) Inventors: Jon S. Choy, Austin, TX (US); Richard Titov Lara Saez, Campinas (BR); Luis Eduardo Rueda Guerrero, Delft (NL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/686,889

(22) Filed: Nov. 27, 2012

(51) Int. Cl.
*H03L 5/00* (2006.01)

(52) U.S. Cl.
USPC .......................... 327/309; 327/321; 327/539

(58) Field of Classification Search
USPC ................... 327/306, 309, 312, 321, 331, 539
See application file for complete search history.

(56) References Cited

U.S. PATENT DOCUMENTS

| | | | |
|---|---|---|---|
| 2,871,380 A | 1/1959 | Morris | |
| 2,998,499 A | 8/1961 | Mankoff | |
| 3,379,897 A | 4/1968 | Icamiiiski | |
| 3,538,347 A | 11/1970 | Spotts | |
| 3,924,456 A | 12/1975 | Vahaviolos | |
| 4,027,177 A * | 5/1977 | Davis | 327/310 |
| 4,084,538 A | 4/1978 | Tanaka | |
| 5,003,197 A | 3/1991 | Nojima | |
| 5,081,410 A * | 1/1992 | Wood | 323/316 |
| 5,093,634 A | 3/1992 | Khoury | |
| 5,136,455 A | 8/1992 | Billingsley | |
| 5,253,204 A | 10/1993 | Hatakeyama | |
| 5,412,526 A | 5/1995 | Kapp | |
| 5,432,322 A | 7/1995 | Ingram | |
| 5,546,016 A | 8/1996 | Allen | |
| 5,724,652 A | 3/1998 | Graham | |
| 5,742,899 A | 4/1998 | Blackburn | |
| 5,838,524 A | 11/1998 | Phillips | |
| 5,905,679 A | 5/1999 | Tsukikawa | |
| 6,104,170 A | 8/2000 | Lenk | |
| 6,252,493 B1 | 6/2001 | Gunchenko | |
| 6,351,138 B1 | 2/2002 | Wong | |
| 6,664,821 B2 * | 12/2003 | De Haas et al. | 327/108 |
| 6,707,717 B2 | 3/2004 | Jun-Lin | |
| 6,710,603 B2 | 3/2004 | Gregorius | |
| 7,245,468 B2 * | 7/2007 | Griesbach et al. | 361/56 |
| 7,253,600 B2 | 8/2007 | Lee | |
| 7,453,244 B1 * | 11/2008 | Doyle | 323/280 |
| 7,518,348 B1 | 4/2009 | Kobayashi | |
| 7,772,822 B2 | 8/2010 | Kawakami | |
| 2001/0043040 A1 | 11/2001 | Olson | |

(Continued)

OTHER PUBLICATIONS

Yan Li et al., Analog Integrated Circuits Design for Processing Physiological Signals, IEEE Reviews in Biomedical Engineering, vol. 3, Sep. 20, 2010, pp. 93-105.

(Continued)

*Primary Examiner* — Dinh T. Le
(74) *Attorney, Agent, or Firm* — Luiz von Paumgartten

(57) ABSTRACT

Systems and methods for voltage ramp-up protection. In an illustrative, non-limiting embodiment, a method may include monitoring at least one of a first node or a second node, the first node configured to receive a first voltage greater than a second voltage present at a second node, and, in response to a slew rate of the first voltage creating a sneak condition between the first node and the second node, counteracting the sneak condition. For example, the sneak condition may favor an excess current to flow from the first node to the second node. In some cases, counteracting the sneak condition may include maintaining the second voltage below at or below a predetermined value.

11 Claims, 3 Drawing Sheets

(56) References Cited

U.S. PATENT DOCUMENTS

| | | |
|---|---|---|
| 2002/0075060 A1 | 6/2002 | Goodell |
| 2002/0078389 A1 | 6/2002 | Yuan |
| 2002/0101265 A1 | 8/2002 | Yuan |
| 2002/0125871 A1 | 9/2002 | Groom |
| 2003/0160574 A1 | 8/2003 | Gray |
| 2004/0041612 A1 | 3/2004 | Huber |
| 2004/0042139 A1 | 3/2004 | Belverde |
| 2004/0052387 A1 | 3/2004 | Norris |
| 2004/0085117 A1 | 5/2004 | Melbert |
| 2005/0146290 A1 | 7/2005 | Gray |
| 2006/0145673 A1 | 7/2006 | Fogg |
| 2006/0279967 A1 | 12/2006 | Shao |
| 2007/0031817 A1 | 2/2007 | Yan |
| 2007/0046387 A1 | 3/2007 | Blum |
| 2007/0058308 A1 | 3/2007 | Thijs |
| 2007/0206306 A1 | 9/2007 | Hokuto |
| 2007/0242743 A1 | 10/2007 | Scherman |
| 2007/0274014 A1 | 11/2007 | Berberich |
| 2008/0106319 A1 | 5/2008 | Bayerer |
| 2008/0107408 A1 | 5/2008 | Sugie |
| 2008/0255820 A1 | 10/2008 | Pilling |
| 2009/0015978 A1 | 1/2009 | Clark |
| 2009/0051427 A1 | 2/2009 | Miyashita |
| 2009/0111642 A1 | 4/2009 | Sah |
| 2009/0111643 A1 | 4/2009 | Sah |
| 2009/0153223 A1 | 6/2009 | Bayerer |
| 2009/0273331 A1 | 11/2009 | Inoue |
| 2010/0019748 A1 | 1/2010 | Kleine |
| 2010/0079121 A1 | 4/2010 | Yanagawa |
| 2010/0165537 A1 | 7/2010 | Maloney |
| 2010/0207161 A1 | 8/2010 | Shrivastava |
| 2010/0289562 A1 | 11/2010 | Kohama |
| 2010/0308026 A1 | 12/2010 | Vogel |
| 2010/0308027 A1 | 12/2010 | Vogel |
| 2010/0329023 A1 | 12/2010 | Fort |
| 2010/0329059 A1 | 12/2010 | Fort |
| 2011/0046856 A1 | 2/2011 | Egger |
| 2011/0181336 A1 | 7/2011 | Hsu |
| 2011/0299203 A1 | 12/2011 | Ruess |
| 2012/0083952 A1 | 4/2012 | Smith |

OTHER PUBLICATIONS

Qi Yu et al., High PSRR and High-Order Curvature-Compensated Bandgap Voltage Reference, Asia Pacific Conference on Postgraduate Research in Microelectronics and Electronics (PrimeAsia), Sep. 2010, pp. 154-157.

Stanislaw Szczepanski et al., A Linear Fully Balanced CMOS OTA for VHF Filtering Applications, IEEE Transactions on Circuits and Systems on Circuits and Systems-II: Analog and Digital Signal Processing, vol. 44, No. 3, Mar. 1997, pp. 174-187.

Kianoush Souri et al., A 109dB PSRR, 311.1 W Fully-MOSFET Bandgap Voltage Reference in O.131.1m CMOS Technology, 17th IEEE International Conference on Electronics, Circuits, and Systems (ICECS), Dec. 2010, pp. 182-185.

Abhisek Dey et al., A CMOS Bandgap Reference with High PSRR and Improved Temperature Stability for System-on-Chip Applications, International Conference of Electron Devices and Solid-State Circuits (EDSSC), Nov. 2011, pp. 1-2.

Phillip K.T. Mok et al., Design Considerations of Recent Advanced Low-Voltage Low-Temperature-Coefficient CMOS Bandgap Voltage Reference, Proceedings of the IEEE Custom Integrated Circuits Conference, Oct. 2004, pp. 635-642.

Tao Li et al., A Low Voltage Bandgap Reference Circuit with Current Feedback, EECS 413 Project, University of Michigan Department of Electrical Engineering and Computer Science, pp. 1-5.

Xiaozhi Kang et al., A Novel High PSRR Bandgap Over a Wide Frequency Range, 10th IEEE International Conference on Solid-State and Integrated Circuit Technology (ICSICT), Nov. 2010, pp. 418-420.

A. Tamtrakarn et al., Compact outside-rail circuit structure by single-cascode two-transistor topology, IEEE Custom Integrated Circuits Conference, Sep. 2006, pp. 619-622.

Jung-Sheng Chen et al., Impact of MOSFET Gate-Oxide Reliability on CMOS Operational Amplifier in a 130-nm Low-Voltage Process, IEEE Transactions on Device and Materials Reliability, Jun. 2008, pp. 394-405.

Thomas Liechti et al., A 1.8V 12-bit 230-MS/s Pipeline ADC in 0.18 μm CMOS Technology, IEEE Asia-Pacific Conference on Circuits and Systems, 2008, pp. 21-24.

Yat-Hei Lam, CMOS Bandgap References With Self-Biased Symmetrically Matched Current-Voltage Mirror and Extension of Sub-1-V Design, IEEE Transactions on Very Large Scale Integration (VLSI) Systems, vol. 18, No. 6, Jun. 2010 pp. 857-865.

Jagdish Chand et al., High Voltage Protection for USB Transceivers in 45nm CMOS, IEEE International Symposium on Circuits and Systems (ISCAS), May 2011, pp. 2027-2030.

* cited by examiner

VOLTAGE RAMP-UP PROTECTION

FIELD

This disclosure relates generally to electronic devices, and more specifically, to systems and methods for voltage ramp-up protection.

BACKGROUND

Complementary Metal-Oxide Semiconductor (CMOS) technology is commonly used to manufacture integrated circuits (ICs). Examples of modern ICs include microprocessors, microcontrollers, memories, etc. Generally speaking, one or more components within an IC may operate based upon a "voltage reference." To provide such a voltage reference, a "voltage reference circuit" may be designed within the IC.

An example of a voltage reference circuit is the "bandgap circuit." A bandgap circuit is configured to output a temperature independent voltage reference with a value of approximately 1.25 V, or another value suitably close to the theoretical 1.22 eV bandgap of silicon at 0 K—that is, the energy required to promote an electron from its valence band to its conduction band to become a mobile charge. For example, a typical bandgap circuit may include a set of Self-Cascode MOS Field-Effect Transistor (SCM) structures and one or more bipolar transistor(s) operating in an open loop configuration.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments disclosed herein are directed to systems and methods for voltage ramp-up protection. In many implementations, these systems and methods may be incorporated into a wide range of electronic devices including, for example, computer systems or Information Technology (IT) products (e.g., servers, desktops, laptops, switches, routers, etc.), telecommunications hardware, consumer devices or appliances (e.g., mobile phones, tablets, televisions, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, etc. More generally, the systems and methods discussed herein may be incorporated into any device or system having one or more electronic parts or components.

Figure 1:
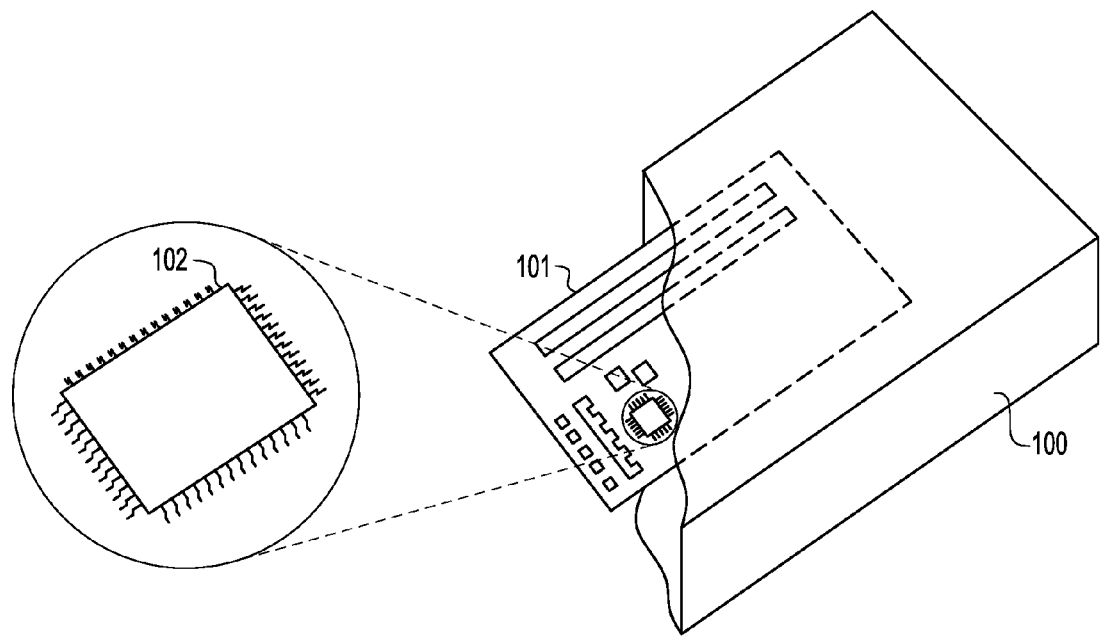
FIG. 1 is a diagram of an example of an electronic device including one or more integrated circuits according to some embodiments.

Turning to FIG. 1, a block diagram of electronic device 100 is depicted. In some embodiments, electronic device 100 may be any of the aforementioned electronic devices, or any other electronic device. As illustrated, electronic device 100 includes one or more Printed Circuit Boards (PCBs) 101, and at least one of PCBs 101 includes one or more electronic chip(s) or integrated circuit(s) 102. In some implementations, integrated circuit(s) 102 may implement one or more of the systems and methods described in more detail below.

Examples of integrated circuit(s) 102 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), or the like. Additionally or alternatively, integrated circuit(s) 102 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate (e.g., DDR, DDR2, DDR3, etc.) RAM, an Erasable Programmable ROM (EPROM), an Electrically Erasable Programmable ROM (EEPROM), etc. Additionally or alternatively, integrated circuit(s) 102 may include one or more mixed-signal or analog circuits, such as, for example, Analog-to-Digital Converter (ADCs), Digital-to-Analog Converter (DACs), Phased Locked Loop (PLLs), oscillators, filters, amplifiers, transformers, etc. Additionally or alternatively, integrated circuit(s) 102 may include one or more Micro-ElectroMechanical Systems (MEMS), Nano-ElectroMechanical Systems (NEMS), or the like.

As such, integrated circuit(s) 102 may include a number of different portions, areas, or regions. These various portions may include one or more processing cores, cache memories, internal bus(es), timing units, controllers, analog sections, mechanical elements, etc. Thus, in various embodiments, integrated circuit(s) 102 may include a circuit configured to receive two or more supply voltages (e.g., two, three, four, etc.). For example, a dual-supply circuit may receive an analog supply voltage configured to power an analog component as well as a digital supply voltage configured to power a logic or digital component. In some implementations, the analog supply voltage may be of the order of 5 V±10%, for example, whereas the digital supply voltage may be of the order of 1.2 V±10%. Other types of circuits may receive any suitable number of supply voltages.

Generally speaking, integrated circuit(s) 102 may be disposed within an electronic component package configured to be mounted onto PCB 101 using any suitable packaging technology such as, for example, Ball Grid Array (BGA) packaging or the like. In some applications, PCB 101 may be mechanically mounted within or fastened onto electronic device 100. It should be noted that, in certain implementations, PCB 101 may take a variety of forms and/or may include a plurality of other elements or components in addition to integrated circuit(s) 102.

Figure 2:
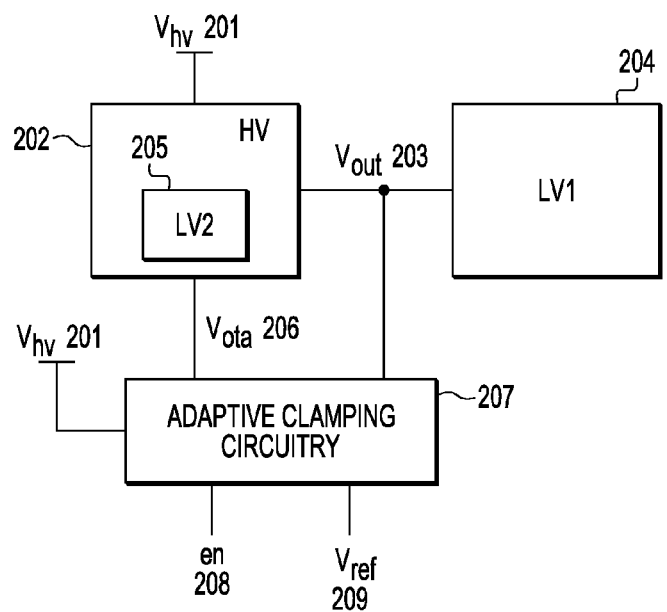
FIG. 2 is a block diagram of an example of an integrated circuit according to some embodiments.

FIG. 2 is a block diagram of integrated circuit 200 that illustrates an example of integrated circuit(s) 102 discussed in FIG. 1 according to some embodiments. As shown, integrated circuit 200 includes high-voltage (HV) circuitry 202 configured to receive high-voltage supply voltage ($V_{hv}$) 201. HV circuitry 202 is operably coupled to first low-voltage (LV1) circuitry 204, and it is configured to provide output voltage ($V_{out}$) 203 thereto. HV circuitry 202 is also operably coupled to adaptive clamping circuitry 207, and it is configured to provide Operational Transconductance Amplifier (OTA)

voltage output ($V_{ota}$) 206 thereto. In this example, HV circuitry 202 may include second low-voltage (LV2) circuitry 205.

Adaptive clamping circuitry 207 is configured to receive $V_{hv}$ 201, and it is operably coupled to node $V_{out}$ 203 (shown in more detail in FIG. 3 below). In addition, adaptive clamping circuitry 207 is also configured to receive enabling signal (en) 208 and reference voltage ($V_{ref}$) 209.

The terms "high-voltage" and "low-voltage" are generally used to indicate that a particular circuit operates with a supply voltage higher than that of another circuit. In general, an HV circuit may have thicker oxide devices than an LV circuit and/or it may use more power than the low-voltage circuit. For example, HV circuitry 202 may be a bandgap reference circuit and LV1 circuitry 204 may be any other analog or digital circuit that operates based upon a lower voltage (e.g., a bandgap voltage) provided by HV circuitry 202 (i.e., $V_{out}$ 203).

In some implementations, $V_{hv}$ 201 may be an analog supply voltage provided to IC 200 by an external source (not shown) and it may be of the order of 5 V±10%, for example, whereas $V_{ref}$ 209 may be a digital supply voltage provided to IC 200 by another external source (not shown), and it may be of the order of 1.2 V±10%. Meanwhile, LV1 circuitry 204 may receive HV circuitry 202's internally generated supply voltage $V_{out}$ 203, which may be of the order of 0.9 V±10%. It should be understood in light of the present disclosure, however, that the exact voltages supplied to HV circuitry 202, adaptive clamping circuitry 207, and LV1 circuitry 204 (i.e., $V_{hv}$ 201, $V_{out}$ 203, and $V_{ref}$ 209) may vary depending upon the type of technology, application, etc.

In some implementations, adaptive clamping circuitry 207 may be configured to operate in response to the application of en signal 208. For example, in some situations, en signal 208 may be provided in connection with a "Power-on-Reset" (PoR) event. A PoR event may include one or more actions performed by or upon IC 200 in response to the turning on of power to the electronic device or part(s) thereof, or other command that creates a reset signal configured to place IC 200 in a known state. Additionally or alternatively, en signal 208 may cease to be provided to adaptive clamping circuitry 207 a predetermined amount of time after the PoR event (e.g., ~10 or ~20 μs).

In operation, adaptive clamping circuitry 207 may be configured to receive $V_{ota}$ 206, compare $V_{out}$ 203 with $V_{ref}$ 209, and modify $V_{out}$ 203 in a manner proportional to the difference between $V_{out}$ 203 and $V_{ref}$ 209. As such, adaptive clamping circuitry 207 may protect LV1 circuitry 204 and/or LV2 circuitry 205 from inadvertent exposure to a high voltage supply. Such exposure may be caused, for example, due to a fast slew rate of $V_{hv}$ 201 during power-up of IC 200. Specifically, in some cases, the rate of change of $V_{hv}$ 201 may be faster than the propagation delay of LV2 circuitry 205, thus creating a "sneak path" or "sneak condition" between node $V_{hv}$ 201 and node $V_{out}$ 203 which, in the absence of adaptive clamping circuitry 207, would allow an excess or undesired current to flow from node $V_{hv}$ 201 to node $V_{out}$ 203.

Accordingly, in some embodiments, adaptive clamping circuitry 207 may monitor node $V_{hv}$ 201 and/or node $V_{out}$ 203. Then, in response to $V_{hv}$ 201's slew rate creating a sneak condition between node $V_{hv}$ 201 and/or node $V_{out}$ 203, adaptive clamping circuitry 207 may operate to counteract the sneak condition.

In some embodiments, the modules or blocks shown in FIG. 2 may represent processing circuitry, logic functions, other circuitry and/or data structures configured to perform perform specified operations. Although these modules are shown as distinct blocks, in other embodiments at least some of the operations performed by these modules may be combined into fewer blocks. For example, in some cases, adaptive clamping circuitry 207 may be integrated into HV circuitry 202. Conversely, any given one of modules 202, 204, 205, and/or 207 may be implemented such that its operations are divided among two or more logical blocks. Although shown with a particular configuration, in other embodiments these various modules or blocks may be rearranged in other suitable ways.

Figure 3:
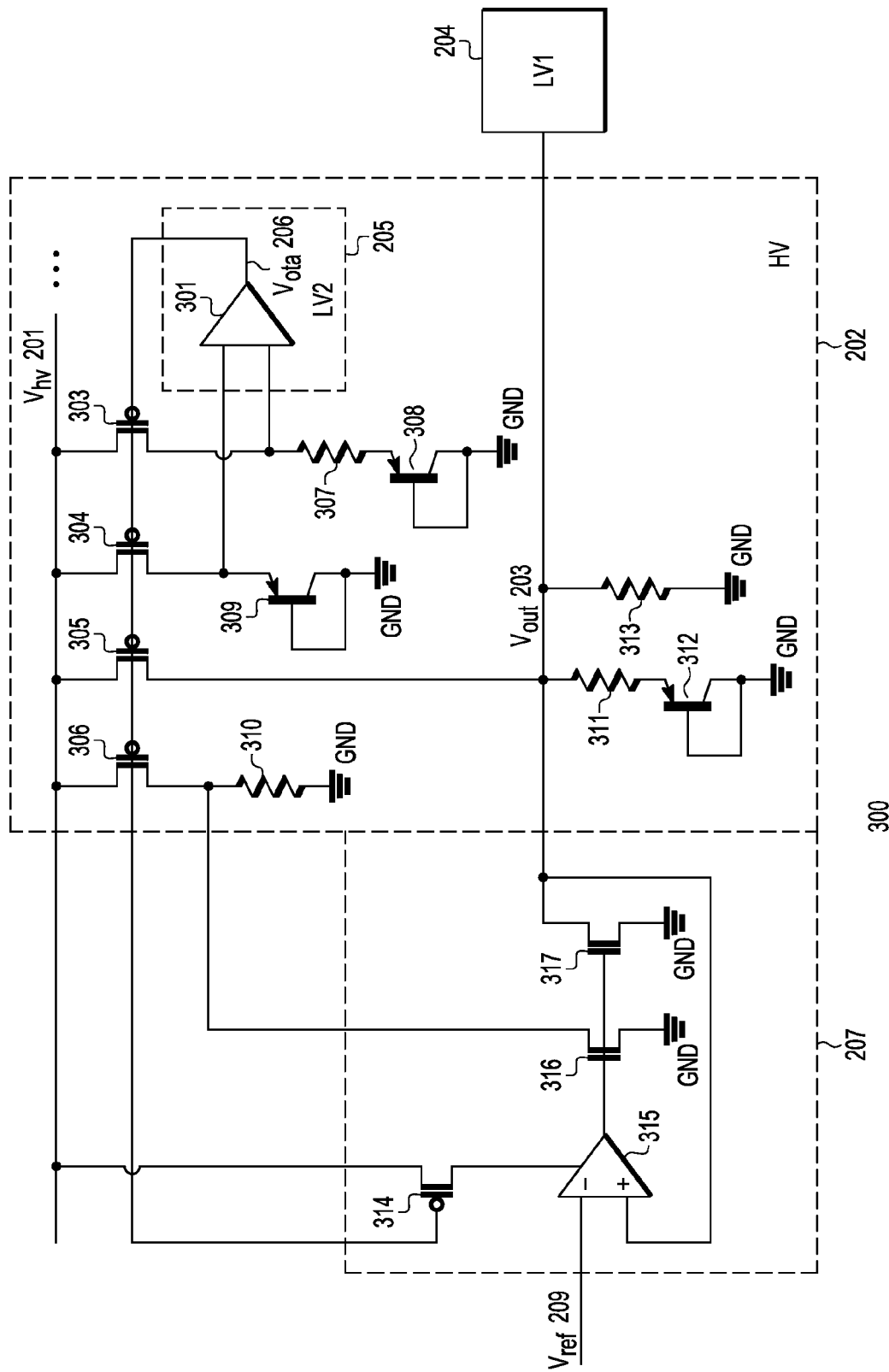
FIG. 3 is a circuit diagram of an example of circuitry configured to provide voltage ramp-up protection according to some embodiments.

FIG. 3 is a circuit diagram of an example of circuitry 300 configured to provide voltage ramp-up protection according to some embodiments. In this particular example, HV circuitry 202 is a bandgap reference circuit that includes LV2 circuitry 205 having OTA 301. The output of OTA 301 produces $V_{ota}$ 206, which is operably coupled to the gates of P-type Metal-Oxide Semiconductor (PMOS) transistors 303-306. PMOS transistors 303-306 have their sources operably coupled to $V_{hv}$ 201. The drain of PMOS transistor 303 is operably coupled to resistor 307, which is operably coupled to the emitter of PNP Bipolar Junction Transistor (BJT) 308, the base and collector of which are operably coupled to ground (Gnd). The drain of PMOS transistor 303 is also operably coupled to a first input of OTA 301.

The drain of PMOS transistor 304 is operably coupled to the emitter of BJT 309, the base and collector of which are coupled to Gnd. The drain of PMOS transistor 304 is also operably coupled to a second input of OTA 205. The drain of PMOS transistor 305 is operably coupled to resistor 311 at node $V_{out}$ 203, and node $V_{out}$ 203 is operably coupled to the emitter of BJT 312, the base and collector of which are operably coupled to Gnd. The drain of PMOS transistor 306 is operably coupled to resistor 310, which in turn is operably coupled to Gnd. Another resistor 313 is operably coupled between node $V_{out}$ 203 and Gnd.

In operation, HV circuitry 202 receives $V_{hv}$ 201 and produces bandgap voltage $V_{out}$ 203. OTA 301 may include one or more low-power elements, and in some cases its signal propagation delay may be incommensurate with the slew rate of $V_{hv}$ 201. In other words, after a certain threshold, the feedback path provided by OTA 301 may not be able to keep up with the rate of change of $V_{hv}$ 201. Accordingly, an undesired or excess electrical current may transiently flow through a "sneak path" within HV circuitry 202 in the direction from $V_{hv}$ 201 to $V_{out}$ 203 (e.g., through PMOS transistor 305). Such "sneak condition" may increase the value of $V_{out}$ 203 and negatively affect the operation of LV1 circuitry 204 and/or LV2 circuitry 205.

Adaptive clamping circuitry 207 may operate to counteract the sneak condition. Particularly, in this example, adaptive clamping circuitry 207 includes PMOS transistor 314 having its source operably coupled to $V_{hv}$ 201, its gate operably coupled to the gate of PMOS transistors 303-306, and its drain biasing amplifier 315. Amplifier 315 may receive $V_{ref}$ 209 at its inverting input and $V_{out}$ 203 at its non-inverting input. The output of amplifier 315 is operably coupled to the gates of N-type MOS (NMOS) transistors 316 and 317. The source of NMOS transistor 316 is operably coupled to the drain of PMOS transistor 306, and the drain of NMOS transistor 316 is operably coupled to Gnd. The source of NMOS transistor 317 is operably coupled to node $V_{out}$ 203, and the drain of NMOS transistor 317 is operably coupled to Gnd.

In some implementations, the channel length of NMOS transistor 316 may be the same as that of PMOS transistors 306, 305, 304, and/or 303. Therefore, the electrical current received at the source of NMOS transistor 316 may be a tail current proportional to the transient current circulating within HV circuitry 202. In other words, amplifier 315 is configured to receive a biasing current proportional to the excess, transient current flowing through HV circuitry 202 due to the slew rate of $V_{hv}$ 201. As such, adaptive clamping circuitry 207 effectively detects the supply slewing of $V_{hv}$ 201.

The output of amplifier 315 is configured to reduce a value of $V_{out}$ 203 in a manner proportional to a difference between $V_{out}$ 203 and $V_{ref}$ 209, thus counteracting the sneak condition within HV circuitry 202. In some cases, an enabling NMOS transistor or switch (not shown) may be operably coupled between the drain of PMOS transistor 314 and amplifier 315. The gate of the enabling transistor may be configured to receive en signal 208 shown in FIG. 2, which may be a PoR signal or the like. Accordingly, adaptive clamping circuitry 207 may ameliorate LV1 circuitry 204's vulnerability to voltage ramping in $V_{hv}$ 201 during power-up or the like, but may be turned off otherwise thus preserving energy.

Figure 4:
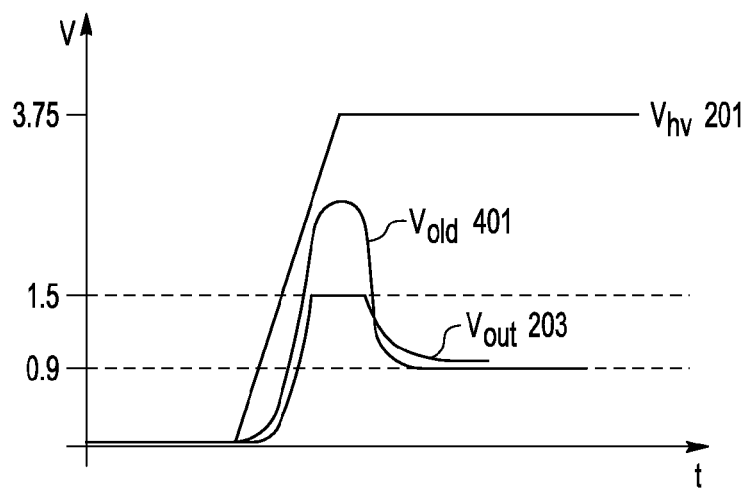
FIG. 4 is a graph illustrating an example of a ramp-up protection operation according to some embodiments.

FIG. 4 shows graph 400 illustrating an example of a ramp-up protection operation according to some embodiments. Particularly, a ramp-up scenario for $V_{hv}$ 201 is depicted where $V_{hv}$ 201 goes from 0 V to 3.75 V in a given period of time (e.g., at a rate of 1000 V/ms). The absence of adaptive clamping circuitry 207 is illustrated by $V_{old}$ 401, which peaks well beyond 1.5 V and then settles at the desired $V_{out}$. In this case, the desired $V_{out}$ value is 0.9 V (e.g., a bandgap reference voltage) to be provided to LV1 circuitry 204. In contrast, when using adaptive clamping circuitry 207, $V_{out}$ 203 is clamped at 1.5 V before settling at a $V_{out}$ of 0.9 V. Therefore, adaptive clamping circuitry 207 effectively protects LV1 circuitry 204 from receiving voltages greater than 1.5 V.

It should be noted that the voltage values shown in FIG. 4 are provided for ease of explanation only. In any given application, those voltage values and/or slew rate(s) may change depending upon the particular application or design requirements.

Figure 5:
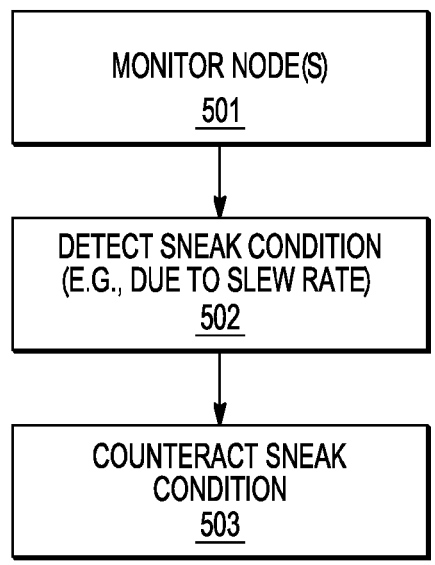
FIG. 5 is a flowchart of an example of a method for voltage ramp-up protection according to some embodiments.

FIG. 5 is a flowchart of an example of method 500 for voltage ramp-up protection. In some embodiments, method 500 may be performed, at least in part, by adaptive clamping circuitry 207 shown in FIGS. 2 and 3. As illustrated, at block 501, method 500 may include monitoring one or more nodes within a high voltage circuit. For example, adaptive clamping circuitry 207 may monitor $V_{hv}$ 201 and/or $V_{out}$ 203 of HV circuitry 202.

At block 502, method 500 may include detecting a sneak condition. For instance, adaptive clamping circuitry 207 may detect, via PMOS transistor 314, that an excess electrical current is flowing through a sneak path within HV circuitry 202. Then, at block 503, method 500 may include counteracting the sneak condition. For example, adaptive clamping circuitry 207 may compare $V_{ref}$ 209 against $V_{out}$ 203 and it may subtract from $V_{out}$ 203 a voltage proportional to the difference between the two, thus maintaining $V_{out}$ 203 under a selected threshold value. In some embodiments, $V_{ref}$ 209 may be a low voltage supply voltage (e.g., of the order of 1.2 V±10%) to IC 200.

It should be understood that the various operations described herein, particularly in connection with FIGS. 2-5, may be implemented in by processing circuitry, electronic hardware, or a combination thereof. The order in which each operation of a given method is performed may be changed, and various elements of the systems illustrated herein may be added, reordered, combined, omitted, modified, etc. It is intended that the invention(s) described herein embrace all such modifications and changes and, accordingly, the above description should be regarded in an illustrative rather than a restrictive sense.

As described above, in some embodiments, adaptive clamping circuitry 207 may ameliorate LV1 circuitry 204's vulnerability to voltage ramp-ups in $V_{hv}$ 201. For example, adaptive clamping circuitry 207 may provide the ability to ramp up HV supplies (e.g., $V_{hs}$ 201) at high slew rates without exposing LV devices (e.g., LV1 circuitry 204) to voltages beyond their reliability range.

In some situations, adaptive clamping circuitry 207 may be able to counteract sneak paths resulting from $V_{hv}$ 201's slew rates of up to 100 V/ms. Additionally or alternatively, adaptive clamping circuitry 207 may be able to counteract sneak paths resulting from $V_{hs}$ 201's slew rates of up to 1000 V/ms. For example, the embodiment shown in FIG. 3 may leverage a mirror current to accelerate the act of clamping $V_{out}$ 203. In other words, the same mechanism that creates the sneak condition—that is, the excess electrical current—may be used to facilitate detection and clamping.

When IC 200 is a dual-supply circuit, for example (or when it is configured to receive more than two supply voltages), it may receive a digital or logical supply voltage from an external circuit that may be used as $V_{ref}$ 209; and which may be used to clamp $V_{out}$ 203 without IC 200 having to generate an additional reference voltage for that purpose. Moreover, with respect to power supply sequencing, it should be noted that the systems and methods described above are designed to operate regardless of which power supply (between an analog and digital power supply to IC 200) is turned on first. For example, if the analog supply to IC 200 is turned on before the digital or logic supply (e.g., $V_{hv}$ 201 is at 5 V while $V_{ref}$ is at 0 V), then $V_{out}$ 203 is clamped to ground, thus protecting LV1 circuitry 204. Conversely, if the digital or logic supply to IC 200 is turned on before the analog supply, there is no sneak path from $V_{hv}$ 201 to $V_{out}$ 203.

Furthermore, adaptive clamping circuitry 207 has a compact footprint and does not compromise the output level of $V_{out}$ 203. In contrast, conventional capacitively coupled solutions (e.g., slew rate rail detectors, etc.) have a large footprint and/or have long latch time out values, which may compromise IC 200's start up timing.

In an illustrative, non-limiting embodiment, an integrated may include, a voltage clamping circuit operably coupled to a first node and to a second node, the first node configured to receive a first voltage and the second node configured to output a second voltage smaller than the first voltage, the voltage clamping circuit configured to modify the second voltage in response to a slew rate of the first voltage triggering a sneak condition between the first and second nodes. For example, the sneak condition may include an electrical path tending to allow an unintended current to flow from the first node to the second node.

Also, the first node and the second nodes may be part of a voltage reference circuit. For instance, the voltage reference circuit may be a bandgap circuit. The voltage reference circuit may include at least one element having a propagation delay incommensurate with the slew rate of the first voltage. For example, the at least one element may include a first amplifier. In that case, the voltage clamping circuit may include a second amplifier configured to receive a biasing current proportional to an excess current to flow from the first node to the second node. The second amplifier may be configured to reduce a value of the second voltage at the second node in a manner proportional to a difference between the second voltage and a digital power supply voltage provided to the integrated circuit.

In some implementations, the voltage clamping circuit may be configured to be turned on in response to a Power-on-Reset (PoR) event. Additionally or alternatively, the voltage clamping circuit may be configured to be turned off a predetermined period of time after the PoR event.

In another illustrative, non-limiting embodiment, a method may include monitoring at least one of a first node or a second node of a circuit, the first node configured to receive a first voltage greater than a second voltage present at a second node, the circuit configured to receive at least one analog supply voltage and at least one digital supply voltage. The method may also include, in response to a slew rate of the first voltage creating a sneak condition between the first node and the second node, counteracting the sneak condition using the at least one digital supply voltage as a reference voltage. For example, sneak condition may favor an excess current's flow from the first node to the second node and, in some situations, the first voltage may be the at least one analog supply voltage.

In some cases, a circuit element operably coupled between the first node and the second node may have a propagation delay longer than a ramp-up time of the first voltage. Also, counteracting the sneak condition may include maintaining the second voltage below at or below a predetermined value defined based upon the reference voltage. Additionally or alternatively, maintaining the second voltage below at or below a predetermined value may include modifying the second voltage in a manner proportional to a difference between the second voltage and the reference voltage.

For example, in cases where the first and second nodes may be part of a first circuit and the first circuit may include a first amplifier, the method may include providing a second amplifier configured to receive a biasing current proportional to a transient current to flow from the first node to the second node. the first circuit is a bandgap voltage circuit. The method may also include protecting a circuit from an overvoltage condition, the circuit operably coupled to the second node and configured to receive the second voltage.

Again, the monitoring and the counteracting may occur in response to a Power-on-Reset (PoR) event. Additionally or alternatively, the monitoring and the counteracting may cease to occur a predetermined period of time after the PoR event.

Although the invention(s) is/are described herein with reference to specific embodiments, various modifications and changes can be made without departing from the scope of the present invention(s), as set forth in the claims below. For example, although presented in the context of bandgap circuits, various systems and methods described herein may be implemented in other types of voltage reference circuits, or other types of circuits. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An integrated circuit, comprising:
a voltage clamping circuit operably coupled to a voltage reference circuit, the voltage reference circuit configured to receive a first voltage at a first node and to output a second voltage smaller than the first voltage at a second node, the voltage reference circuit including a first amplifier having a propagation delay incommensurate with a slew rate of the first voltage, the voltage clamping circuit including a second amplifier having a first input coupled to receive a predetermined voltage and a second input coupled to the second node, the second amplifier configured to receive a biasing current proportional to an excess current flow from the first node to the second node, an output of the second amplifier configured to drive the second node to reduce a value of the second voltage in response to the slew rate of the first voltage triggering a sneak condition between the first and second nodes.

2. The integrated circuit of claim 1, wherein the sneak condition comprises an electrical path tending to allow the excess current to flow from the first node to the second node.

3. The integrated circuit of claim 1, wherein the voltage reference circuit is a bandgap circuit.

4. The integrated circuit of claim 1, wherein the second amplifier is configured to reduce a value of the second voltage at the second node in a manner proportional to a difference between the second voltage and a digital power supply voltage provided to the integrated circuit.

5. The integrated circuit of claim 1, wherein the voltage clamping circuit is configured to be turned on in response to a Power-on-Reset (PoR) event.

6. The integrated circuit of claim 5, wherein the voltage clamping circuit is configured to be turned off a predetermined period of time after the PoR event.

7. A method, comprising:
converting a first voltage at a first node into a second voltage at a second node using a circuit, the circuit including a first amplifier operably coupled between the first node and the second node, the first node configured to receive a first voltage greater than a second voltage present at the second node, the circuit configured to receive at least one analog supply voltage and at least one digital supply voltage;
providing a second amplifier having a first input coupled to receive a predetermined voltage and a second input coupled to the second node, the second amplifier configured to receive a biasing current proportional to a transient current to flow from the first node to the second node; and
in response to a slew rate of the first voltage creating a sneak condition between the first node and the second node, the second amplifier driving the second node for counteracting the sneak condition using the at least one digital supply voltage as a reference voltage.

8. The method of claim 7, wherein the first voltage is the at least one analog supply voltage.

9. The method of claim 7, wherein the first amplifier has a propagation delay longer than a ramp-up time of the first voltage.

10. The method of claim 7, wherein counteracting the sneak condition includes maintaining the second voltage below at or below a predetermined value defined based upon the reference voltage.

11. The method of claim 7, further comprising protecting another circuit from an overvoltage condition, the other circuit operably coupled to the second node and configured to receive the second voltage.

* * * * *